(12) United States Patent
Cheng et al.

(10) Patent No.: US 7,223,694 B2
(45) Date of Patent: May 29, 2007

(54) METHOD FOR IMPROVING SELECTIVITY OF ELECTROLESS METAL DEPOSITION

(75) Inventors: Chin-Chang Cheng, Portland, OR (US); Valery M. Dubin, Portland, OR (US); Peter K. Moon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/459,131

(22) Filed: Jun. 10, 2003

(65) Prior Publication Data

US 2004/0253814 A1    Dec. 16, 2004

(51) Int. Cl.
    *H01L 21/44* (2006.01)
(52) U.S. Cl. ............... 438/677; 438/678; 257/E21.537
(58) Field of Classification Search ........... 438/98, 438/597, 669, 674, 677, 678, 679, 976, 908, 438/951, 680, 681, 685, 637, 638, 641, 666, 438/670, 671, 672, 675, 676; 257/E21.537
See application file for complete search history.

(56) References Cited

U.S. PATENT DOCUMENTS

| | | | | |
|---|---|---|---|---|
| 4,803,147 A | * | 2/1989 | Mueller et al. | 430/288.1 |
| 5,180,687 A | * | 1/1993 | Mikoshiba et al. | 438/675 |
| 5,186,984 A | * | 2/1993 | Gabbert | 427/443.1 |
| 5,275,861 A | * | 1/1994 | Vaughn | 428/76 |
| 5,615,030 A | * | 3/1997 | Harada et al. | 349/110 |
| 5,654,245 A | * | 8/1997 | Allen | 438/629 |
| 5,660,883 A | * | 8/1997 | Omura | 427/304 |
| 5,674,787 A | * | 10/1997 | Zhao et al. | 438/627 |
| 5,709,588 A | * | 1/1998 | Muroyama | 451/41 |
| 5,909,635 A | | 6/1999 | Marieb et al. | |
| 5,960,293 A | * | 9/1999 | Hong et al. | 438/397 |
| 6,037,664 A | * | 3/2000 | Zhao et al. | 257/758 |
| 6,100,195 A | * | 8/2000 | Chan et al. | 438/687 |
| 6,165,894 A | * | 12/2000 | Pramanick et al. | 438/627 |
| 6,214,728 B1 | * | 4/2001 | Chan et al. | 438/678 |
| 6,271,135 B1 | * | 8/2001 | Palmans et al. | 438/687 |
| 6,333,560 B1 | * | 12/2001 | Uzoh | 257/774 |
| 6,432,826 B1 | * | 8/2002 | Emami et al. | 438/692 |
| 6,479,384 B2 | * | 11/2002 | Komai et al. | 438/687 |
| 6,524,957 B2 | * | 2/2003 | Merchant et al. | 438/687 |
| 6,528,409 B1 | * | 3/2003 | Lopatin et al. | 438/618 |
| 6,537,913 B2 | | 3/2003 | Modak | |
| 6,566,757 B1 | | 5/2003 | Banerjee et al. | |
| 6,573,606 B2 | * | 6/2003 | Sambucetti et al. | 257/762 |
| 6,815,357 B2 | * | 11/2004 | Homma et al. | 438/695 |
| 7,060,618 B2 | * | 6/2006 | Inoue et al. | 438/687 |
| 2003/0038903 A1 | * | 2/2003 | Kobayashi et al. | 349/100 |
| 2003/0098241 A1 | * | 5/2003 | Homma et al. | 205/206 |
| 2003/0218253 A1 | * | 11/2003 | Avanzino et al. | 257/758 |
| 2003/0219968 A1 | * | 11/2003 | Adem et al. | 438/622 |
| 2004/0099908 A1 | * | 5/2004 | Durlam et al. | 257/347 |
| 2006/0040487 A1 | * | 2/2006 | Inoue et al. | 438/597 |

* cited by examiner

*Primary Examiner*—Michael Lebentritt
*Assistant Examiner*—Stanetta Isaac
(74) *Attorney, Agent, or Firm*—Blakely, Sokoloff, Taylor & Zafman LLP

(57) ABSTRACT

A method of depositing a metal cladding on conductors in a damascene process is described. The potential between, for instance, cobalt ions in electroless solution and the surface of an ILD between the conductors is adjusted so as to repel the metal from the ILD.

14 Claims, 3 Drawing Sheets

METHOD FOR IMPROVING SELECTIVITY OF ELECTROLESS METAL DEPOSITION

FIELD OF THE INVENTION

The invention relates to interconnect structures in semiconductor devices.

BACKGROUND OF THE INVENTION

Many integrated circuits contain multi-layer electrical interconnect structures to provide electrical signals to logical elements such as transistors located on a semiconductor substrate. The interconnect structures often contain interconnect lines which are spaced apart in a nearly coplanar arrangement within a dielectric material that insulates the lines from one another. Selected connections between interconnect lines on different levels are made by vias formed through the insulating material.

The interconnect lines are often made of highly conductive metals or alloys. Copper has become a widely used material due, in part, to its low electrical resistance compared to other metals. Typically, the copper is electroplated in the damascene process. A barrier layer is used to prevent diffusion of the copper into dielectric layers. Chemical mechanical polishing (CMP) removes the copper and barrier layers from the upper surface of the dielectric, leaving the barrier layer and copper inlaid within the trenches and vias. A cladding metal, in some cases, is selectively deposited over the copper to seal it and to provide an etchant stop for additional interconnect layers.

Problems associated with forming the cladding are discussed conjunction with FIG. 1.

DETAILED DESCRIPTION

An improvement in a process is described for electrolessly plating metal cladding onto conductors inlaid in a interlayer dielectric (ILD). In the following description, numerous specific details are set forth such as specific chemistry, in order to provide a thorough understanding of the present invention. It will be apparent to one skilled in the art that the present invention may be practiced without these specific details. In other instances, well known processing steps, including electroless plating steps, are not described in detail in order not to unnecessarily obscure the present invention.

PROBLEM FOUND IN PRIOR ART

Figure 1:
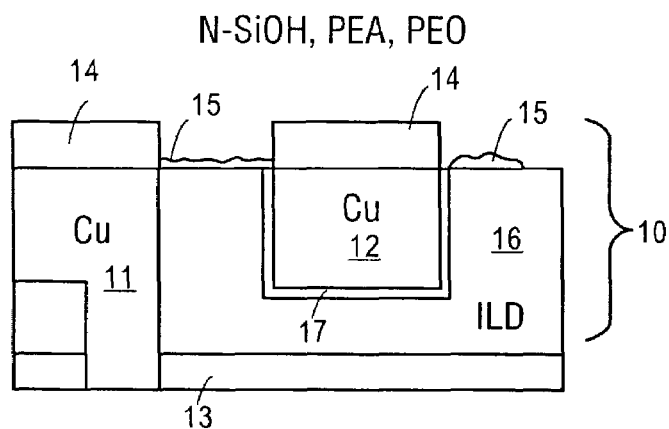
FIG. 1 is a prior art cross-sectional elevation view of a substrate showing an interconnect layer with cladding over the conductors, including parasitic cladding material between the conductors.

Referring first to FIG. 1, an interconnect structure 10 is shown which may be one of several interconnect layers in an integrated circuit. The interconnect structure 10 is formed in an ordinary manner using a damascene process. An interlayer dielectric (ILD) 16 is first etched, defining openings for conductors and vias. The vias connect selected conductors to underlying conductors in another interconnect structure. In FIG. 1, a conductor 12 is shown along with a conductor and via 11. The ILD 16 is formed on an etchant stop layer or hard mask layer 13.

Typically, the copper is electroplated onto a barrier layer 17. After polishing, the upper surface of the conductors is exposed along with the dielectric between the conductors. Then, as is sometimes done, a metal cladding 14 is selectively deposited onto the exposed copper surfaces. For instance, the cladding 14 may be cobalt rich alloy, deposited such that it self-aligns with the copper.

Unfortunately, the cladding metal sometimes also adheres to the upper surface of the dielectric as shown by metal 15 in FIG. 1. The metal 15 may cause parasitic paths, shorting adjacent conductors. This is a disadvantage to the cladding which offsets its advantage of providing a seal for the cooper as well as an etchant stop for subsequent interconnect layers.

OVERVIEW OF EMBODIMENT OF PRESENT INVENTION

Figure 2:
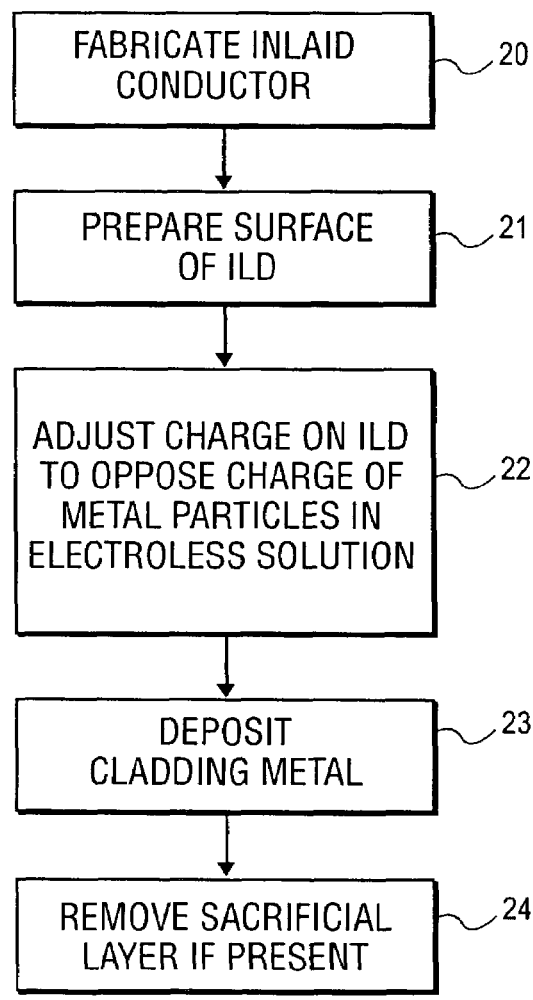
FIG. 2 is a flow diagram showing the steps used in the present invention.

An overview of an embodiment of the present invention is shown in FIG. 2, beginning with step 20. Step 20 includes the formation of inlaid conductors in an ILD using, for instance, a damascene or dual-damascene process. Then, chemical mechanical polishing (CMP) is used to expose the upper surface of the conductors and the dielectric between the conductors.

Now, as shown by step 21, the exposed surface of the dielectric between the conductors is cleaned and prepared as will be described in more detail below. This cleaning includes the removal of any remaining copper or barrier layer materials in addition to making the exposed surface of the dielectric more hydrophilic.

Next, as shown by step 22, the relative charge between the metal particles, such as the cobalt particles, and the dielectric surface are adjusted so that they oppose one another. This helps prevent the formation of the cladding on the dielectric. Several processes for adjusting the charge are described. One includes the formation of a sacrificial layer which is subsequently removed following the metal cladding deposition. Another, is to adjust the charge directly on the dielectric surface. A third described method is to adjust the charge of the metal particles within an electroless solution. These will be described in more detail below.

Following the completion of step 22, the electroless deposition of a cladding material such as cobalt alloy occurs. Then as shown by step 24, where a sacrificial layer is used, this layer is lifted from the surface to remove the metal that adhered to it.

Figure 3:
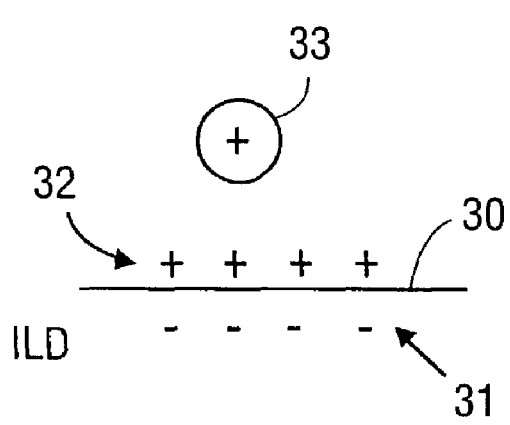
FIG. 3 illustrates the surface of an ILD and the charge alteration that occurs to repel particles.
Figure 4:
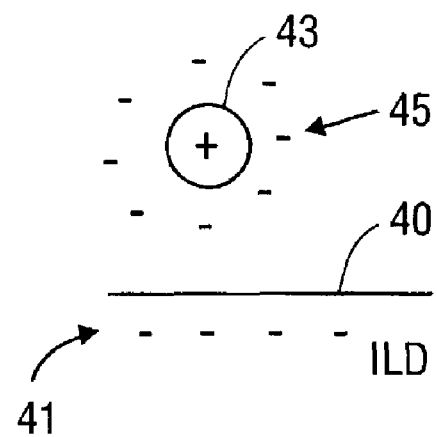
FIG. 4 illustrates a metal particle and the charge alteration that occurs to prevent the metal particle from bonding to an ILD surface.

FIGS. 3 and 4 graphically illustrate what the present invention seeks to accomplish. For instance in FIG. 3, a typically anionic surface 30 of an ILD is shown by the charge 31. Processing is used to change the surface such that it becomes cationic as shown by the charge 32. This will cause a repulsion of the particles 33 which are, for instance, of cobalt alloy.

In FIG. 4 the same result is achieved, however here, the surface 40 of the ILD remains somewhat negative as shown by the charge 41. Rather, negative charge 45 is introduced at the metal particles 43 to cause them to be repelled from the surface 40, without preventing the metal ions 43 from participating in the electroless plating process.

EXAMPLES OF PROCESS

Figure 5:
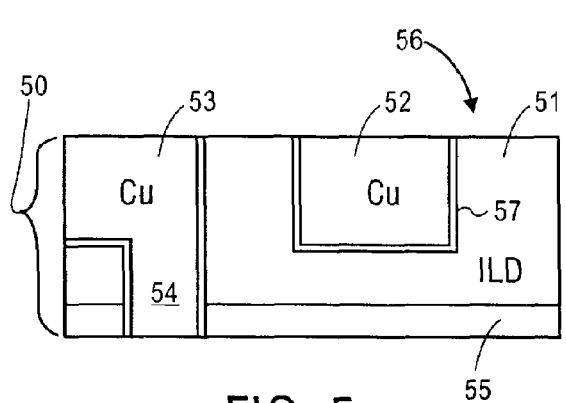
FIG. 5 is a cross-section elevation view of an interconnect layer showing inlaid conductors formed with a damascene process.

Referring now to FIG. 5, an interconnect layer 50 is shown formed with damascene processing. It includes the copper conductors 52 and 53, and the via 54 formed in an ILD 51. An etchant stop or hard mask 55 is shown for separating the interconnect layer 50 from other layers. Additionally, a barrier layer 57 lines the trenches and vias to prevent the diffusion of the copper into the surrounding dielectric.

After planarization, for example, by chemical-mechanical polishing, the upper surface 56 of the interconnect layer 50 of FIG. 5 comprises exposed copper conductors separated by regions of the ILD 51. Typically, at this point in processing, the upper surface is cleaned with an acid such as sulfuric, methansulfonic, citric or sulfonic along with, for instance, hot ultrapure water, to etch and clean the copper from between the conductors. Additionally, the wafer may be preheated to achieve better uniformity for an electroless deposition of cladding. Other cleaning steps may also be used.

Figure 6:
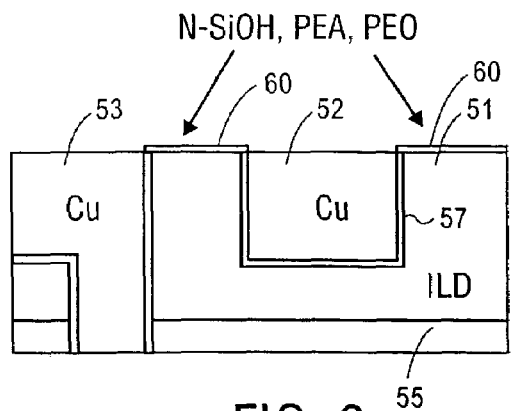
FIG. 6 illustrates the structure of FIG. 5 after treatment of the surface of the ILD.

In one embodiment of the present invention, a sacrificial layer 60 (FIG. 6), is formed on the upper surface of the ILD 51 between the conductors. This layer, as will be later discussed, is readily removable from the ILD after the metal cladding deposition. The sacrificial layer 60 may be, for instance, formed from a polymer silanol (generically, $HO[(CH_3)_2 SiO]_n H$) shown in the drawings simply as SiOH, along with active compounds such as T2910, polyvinyl alcohols and polyethylene oxides. (T2910 refers to a product designation of Trizam for citrate monobasic solution.)

In another embodiment, the surface of the ILD is treated with active compounds changing its potential such as citric, malonic, or tartaric acids.

In yet another embodiment, surface active compounds are added to the plating bath such as T2910, polyethylene glycol/polypropylene glycol, polyvinyl alcohol, or polyethylene oxide to change the zeta potential of the particles in solution.

Figure 7:
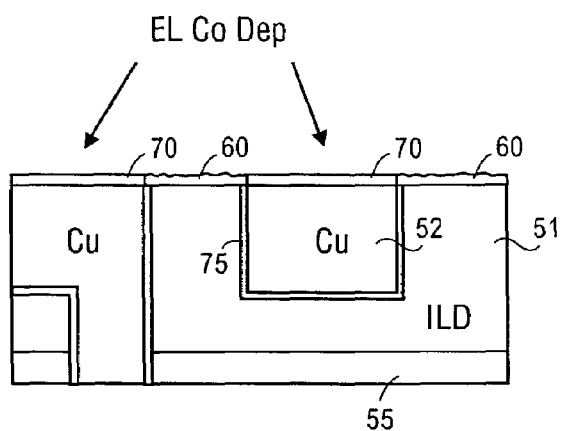
FIG. 7 illustrates the structure of FIG. 6 after the deposition of an electroless cladding.
Figure 8:
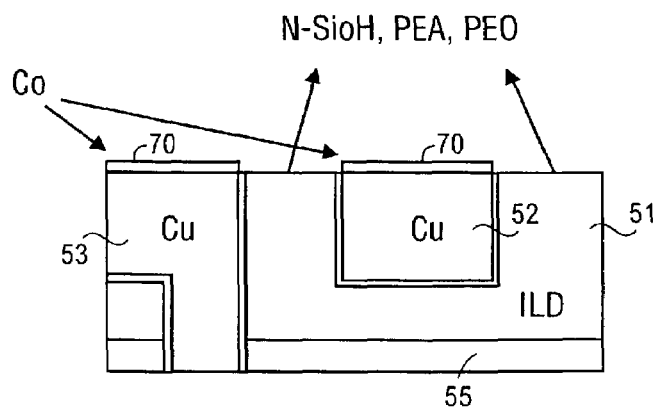
FIG. 8 illustrates the structure of FIG. 7 after removal of a sacrificial layer.

Following this, the electroless deposition of the metal cladding such as cobalt occurs as shown in FIG. 7. This deposition is selective or self-aligning, that is, it forms principally on the copper and not on the dielectric.

Electroless metal plating is an autocatalytic (non-electrolytic) method of deposition from solution. The electrons required for the metal reduction are supplied by the simultaneous oxidation of reducing agents on the catalytic surface and reduction of metal ions. Plating is initiated on a catalyzed surface and is sustained by the catalytic nature of the plated metal surface itself.

An electroless plating solution generally includes water, a water soluble compound containing the metal (in ion form) to be deposited onto the target (surface), a complexing agent that prevents chemical reduction of the metal ions in solution while permitting selective chemical reduction on a surface of the target, and a chemical reducing agent for the metal ions. Additionally, the plating solution may also include a buffer for controlling pH and various optional additives, such as solution stablizers and surfactants. It is, of course, understood that the composition of a plating solution will vary depending on the desired outcome.

In terms of introducing metal ions of cobalt, metal ions (shunt material precursors) such as cobalt supplied by cobalt chloride, cobalt sulfate, etc., are introduced in a concentration range, in one embodiment, of about 10-70 grams per liter (g/l), alone or with the addition of compound containing metal ions of a desired alloy constituent (e.g., Ni, Cu, Cd, Zn, etc.). Examples of suitable additional compounds include ammonium tungstate (for alloying with W), ammonium perrhenate (for alloying with Re), etc. A suitable concentration range for the additional compound(s) includes 0.1 to 10 g/l.

To introduce the metal ions onto a conductive surface such as copper, tantalum or titanium, the oxidation number of the introduced metal ions is reduced. To reduce the oxidation number of the metal ions, one or more reducing agents are included in the bath. In one embodiment, the reducing agents are selected to be metal-free reducing agents such as ammonium hypophosphite, dimethylamine borate (DMAB), and/or glyoxylic acid in a concentration range of about 2 to 30 g/l. The bath may also include one or more metal-free chelating agents such as citric acid, ammonium chloride, glycine, acetic acid, and/or malonic acid in the concentration range of about 5 to 70 g/l for, in one respect, complexing copper. Still further, one or more organic additives may also be included to facilitate hydrogen evolution. Suitable organic additives include Rhodafac RE-610™, cystine, Triton x-100™, polypropylene glycol (PPG)/polyethylene glycol (PEG) (in a molecular range of approximately 200 to 10,000) in a concentration range of about 0.01 to 5 g/l. An alkaline metal-free pH adjuster such as ammonium hydroxide ($NH_4OH$), tetramethyl ammonium hydroxide (TMAH), tetraethyl ammonium hydroxide (TEAH), tetrapropyl ammonium hydroxide (TPAH), and/or tetrabutyl ammonium hydroxide (TBAH), may further be included in the bath to achieve a suitable pH range, such as a pH range of 3 to 14.

A representative process temperature for an electroless plating bath such as described is on the order of 30 to 90° C. For details concerning the electroless deposition of cladding metals, see co-pending application Ser. No. 09/753,256, filed Dec. 28, 2000, titled "Interconnect Structures and a Method of Electroless Introduction of Interconnect Structures."

The resultant structure following the cladding deposition is shown in FIG. 7. The cladding 70 is formed over the conductors and between the sacrificial layer 60.

Where a sacrificial layer 60 is used, it is removed as shown by step 24 of FIG. 2. The layer 60, depending on its nature, may be removed by heat/plasma treatment, solvent treatment or mechanical treatment (scrub, sonic). Chemicals such as ultrapure water and dilute isopropyl alcohol, dilute acids such as methane sulfonic, citric, sulfuric, phosphoric, nitric, or dilute bases such as TMAH or etchant such as ammonium persulfate may be used.

Thus, a method of forming a metal cladding on conductors while minimizing the deposition of the metal on dielectric disposed between the conductors has been described.

What is claimed is:

1. A process for forming an interconnect layer in an integrated circuit comprising:

forming inlaid conductors in an interlayer dielectric (ILD), the conductors having exposed conductor surfaces separated by ILD surfaces;

treating the ILD surfaces such that the relative charge between metal particles in an electroless solution and the ILD surfaces are opposite one another, wherein the treatment comprises the formation of a sacrificial layer on the ILD surface between the conductors; and forming a metal cladding on the exposed conductor surfaces from the electroless deposition solution containing the metal particles, such that the opposite charge between the metal particles and the surfaces of the ILD cause the particles to be repelled from the ILD surfaces.

2. The process defined by claim 1, wherein the sacrificial layer comprises a polymer.

3. The process defined by claim 2, wherein the sacrificial layer is treated with a compound containing silanol.

4. The process defined by claim 2, wherein the sacrificial layer comprises polyvinyl alcohol.

5. The process defined by claim 2, wherein the sacrificial layer comprises polyethylene oxides.

6. The process defined by claim 1, wherein the ILD surface is treated with compounds selected from the group of citric, malonic, and tartaric acids.

7. A process for forming an interconnect layer in an integrated circuit comprising:

forming inlaid conductors using a damascene process where exposed surfaces of the conductors are separated by a dielectric surface;

forming a sacrificial layer between the conductors on the dielectric surface such that the relative charge between the sacrificial layer and metal particles in an electroless solution repel each other;

forming a metal cladding on the exposed surfaces of the conductors from the metal particles in the electroless solution; and removing the sacrificial layer.

8. The method defined by claim 7, wherein the metal cladding comprises cobalt.

9. The method defined by claim 7, wherein the sacrificial layer comprises a polymer.

10. The process defined by claim 9, wherein the sacrificial layer is treated with a compound containing silanol.

11. The process defined by claim 9, wherein the sacrificial layer comprises polyvinyl alcohol.

12. The process defined by claim 9, wherein the sacrificial layer comprises polyethylene oxides.

13. A process for forming an interconnect layer in an integrated circuit comprising:

forming inlaid conductors in an interlayer dielectric (ILD), the conductors having exposed conductor surfaces separated by ILD surfaces;

treating the ILD surfaces with compounds selected from the group of citric, malonic, or tartaric acids;

forming a sacrificial layer in between the conductors; and forming metal cladding on the exposed conductor surfaces from particles in an electroless deposition solution.

14. The process defined by claim 13, wherein the metal cladding comprises cobalt.

* * * * *